(12) United States Patent
Fouda et al.

(10) Patent No.: US 10,422,913 B2
(45) Date of Patent: Sep. 24, 2019

(54) METAMATERIAL-BASED ELECTROMAGNETIC FIELD MEASUREMENT DEVICE

(71) Applicant: Halliburton Energy Services, Inc., Houston, TX (US)

(72) Inventors: Ahmed E. Fouda, Houston, TX (US); Burkay Donderici, Houston, TX (US)

(73) Assignee: Halliburton Energy Services, Inc., Houston, TX (US)

(*) Notice: Subject to any disclaimer, the term of this patent is extended or adjusted under 35 U.S.C. 154(b) by 0 days.

(21) Appl. No.: 15/311,345

(22) PCT Filed: Nov. 7, 2014

(86) PCT No.: PCT/US2014/064626
§ 371 (c)(1),
(2) Date: Nov. 15, 2016

(87) PCT Pub. No.: WO2016/025009
PCT Pub. Date: Feb. 18, 2016

(65) Prior Publication Data
US 2017/0090061 A1 Mar. 30, 2017

Related U.S. Application Data

(63) Continuation of application No. PCT/US2014/051933, filed on Aug. 20, 2014, which
(Continued)

(51) Int. Cl.
*G01V 3/26* (2006.01)
*G01R 29/08* (2006.01)
(Continued)

(52) U.S. Cl.
CPC .......... *G01V 3/26* (2013.01); *E21B 47/02216* (2013.01); *G01R 29/08* (2013.01);
(Continued)

(58) Field of Classification Search
CPC ....... G01V 3/28; G01V 3/26; E21B 47/02216
(Continued)

(56) References Cited

U.S. PATENT DOCUMENTS 4,549,135 A 10/1985 Vaidya
5,365,391 A 11/1994 Sugiyama et al.
(Continued)

FOREIGN PATENT DOCUMENTS

EP 1154286 A1 11/2001
WO WO 2013/072844 A1 5/2013
(Continued)

OTHER PUBLICATIONS

International Search Report and The Written Opinion of the International Search Authority, or the Declaration, dated Apr. 28, 2015, PCT/US2014/064626, 10 pages, ISA/KR.
(Continued)

*Primary Examiner* — Reena Aurora

(57) ABSTRACT

An electromagnetic field measuring device utilizes metamaterials to manipulate electromagnetic fields. Such a device is useful in a variety of applications including, for example, downhole gradiometric ranging.

19 Claims, 7 Drawing Sheets

Related U.S. Application Data is a continuation of application No. PCT/US2014/051328, filed on Aug. 15, 2014.

(51) Int. Cl.

| | | |
|---|---|---|
| *H01Q 1/04* | (2006.01) | |
| *H01Q 15/00* | (2006.01) | |
| *H01Q 9/06* | (2006.01) | |
| *E21B 47/022* | (2012.01) | |
| *G01R 33/02* | (2006.01) | |
| *G01R 33/022* | (2006.01) | |

(52) U.S. Cl.
CPC ......... *G01R 33/02* (2013.01); *G01R 33/022* (2013.01); *H01Q 1/04* (2013.01); *H01Q 9/065* (2013.01); *H01Q 15/0086* (2013.01)

(58) Field of Classification Search
USPC ........................................................ 324/338
See application file for complete search history.

(56) References Cited

U.S. PATENT DOCUMENTS

| | | | |
|---|---|---|---|
| 5,434,501 A | 7/1995 | Esman et al. | |
| 6,417,952 B1 | 7/2002 | Kawai et al. | |
| 7,463,027 B2 | 12/2008 | Prammer et al. | |
| 7,538,946 B2 | 5/2009 | Smith et al. | |
| 9,964,659 B2* | 5/2018 | Fouda ................ | G01V 3/30 |
| 2010/0225313 A1 | 9/2010 | Blanz | |
| 2010/0289490 A1 | 11/2010 | Fan et al. | |
| 2011/0204891 A1 | 8/2011 | Drake et al. | |
| 2012/0019892 A1 | 1/2012 | Bowers et al. | |
| 2012/0212375 A1 | 8/2012 | Depree, IV | |
| 2013/0127458 A1 | 5/2013 | Mizutani et al. | |
| 2014/0184229 A1 | 7/2014 | Bloemenkamp | |
| 2016/0252644 A1* | 9/2016 | Fouda ................ | G01V 3/28 |
| | | | 324/355 |
| 2017/0254917 A1* | 9/2017 | Fouda ................ | G01V 3/28 |

FOREIGN PATENT DOCUMENTS

| | | |
|---|---|---|
| WO | WO 2014/027322 A2 | 2/2014 |
| WO | WO 2014/085199 A1 | 6/2014 |
| WO | WO 2014/089490 A1 | 6/2014 |

OTHER PUBLICATIONS

Erentok, et al., "Low Frequency Lumped Elementbased Negative Index Metamaterial," Applied Physics Letters, vol. 91, No. 18, 2007.

Freire, et al., "Experimental Demonstration of µ=−1 Metamaterial Lens for Magnetic Resonance Imaging," Applied Physics Letters, vol. 93, 2008.

Gömöry, et al., "Experimental Realization of a Magnetic Cloak," Science, vol. 335, No. 6075, 2012, pp. 1466-1468.

Jiang, et al., "Enhancement of Current Density by Dc Electric Concentrator," Scientific Reports, vol. 2, 2012.

Kwon, et al. "Transformation Electromagnetics: An Overview of the Theory and Applications," IEEE Antennas and Propagation Magazine, vol. 52, No. 1, 2010, pp. 24-46.

Lai, et al., "Composite Right/Left-Handed Transmission Line Metamaterials," *IEEE Microwave Magazine*, Sep. 2004, vol. 5, No. 3, pp. 34-50.

Magnus, et al., "A DC Magnetic Metamaterial," Nature Materials, vol. 7, No. 4, 2008, pp. 295-297.

Narayana, et al., "DC Magnetic Cloak," Advanced Materials, vol. 24, No. 1, 2012, pp. 71-74.

Pendry, J. B. "A Chiral Route to Negative Refraction," Science, vol. 306, No. 5700, 2004, pp. 1353-1355.

Pendry, et al., "Controlling electromagnetic Fields," *Science*, vol. 312, No. 5781, 2006, pp. 1780-1782.

Pendry, J.B. "Metamaterials and the Control of Electromagnetic Fields," in *Conference on Coherence and Quantum Optics. Optical Society of America*, 2007.

Rahm, et al. "Optical Design of Reflectionless Complex Media by Finite Embedded Coordinate Transformations," Physical Review Letters, vol. 100, No. 6, 2008.

Schurig, et al., "Metamaterial Electromagnetic Cloak at Microwave Frequencies," Science, vol. 314, No. 5801, 2006, pp. 977-980.

Smith, et al, "Determination of Effective Permittivity and Permeability of Metamaterials From Reflection and Transmission Coefficients," Physical Review B, vol. 65, No. 19, 2002.

Tichit, et al., "Antenna Design Concepts Based on Transformation Electromagnetics Approach," Radioengineering, vol. 21, No. 4, 2012, p. 955.

Veryaskin, Alexey V., "Magnetic Gradiometry: A New Method for Magnetic Measurements," *Sensors and Actuators A Physical*, Jun. 5, 2001, vol. 91, Nos. 1-2, pp. 233-235.

Wilson, et al., "Multifocal Flat Lens With Left-Handed Metamaterial," Applied Physics Letters, vol. 86, No. 2, 2005.

Xie, et al. "Proposal of Cylindrical Rolled-Up Metamaterial Lenses for Magnetic Resonance Imaging Application and Preliminary Experimental Demonstration," Progress in Electromagnetics Research, vol. 124, 2012, pp. 151-162.

Cao et al., "Strongly Tunable Circular Dichroism in Gammadion Chiral Phase-Change Metamaterials", *Optical Express*, vol. 21, No. 23, Nov. 18, 2013.

Preliminary Search Report and Written Opinion issued for French Patent Application No. 1557749, dated Feb. 16, 2018.

* cited by examiner

METAMATERIAL-BASED ELECTROMAGNETIC FIELD MEASUREMENT DEVICE

PRIORITY

This application is a U.S. National Stage patent application of International Patent Application No. PCT/US2014/064626, filed on Nov. 7, 2014, which claims priority to Patent Cooperation Treaty Application Nos. PCT/US14/51328, entitled "TILTED GAIN ANTENNA FOR PROPAGATION LOGGING TOOLS," filed Aug. 15, 2014, naming Burkay Donderici and Ahmed E. Fouda as inventors; and PCT/US14/51933, entitled "SHIELDING DEVICE FOR IMPROVING DYNAMIC RANGE OF ELECTROMAGNETIC MEASUREMENTS," filed Aug. 20, 2014, all having the same inventorship, the benefits of which are claimed and the disclosures of which are hereby incorporated by reference in their entirety.

FIELD OF THE DISCLOSURE

The present disclosure relates generally to electromagnetic field measuring devices and, more specifically, to an electromagnetic field measuring device that splits and inverts electromagnetic waves through the use of metamaterials.

BACKGROUND

Determining the position and direction of a conductive pipe (metallic casing, for example) accurately and efficiently is required in a variety of downhole applications. Perhaps the most important of these applications is the case of a blown out well in which the target well must be intersected very precisely by a relief well in order to stop the blowout. Other important applications include drilling of a well parallel to an existing well in Steam Assisted Gravity Drainage ("SAGD") systems, avoiding collisions with other wells in a crowded oil field where wells are drilled in close proximity to each other and tracking an underground drilling path using a current injected metallic pipe over the ground as a reference.

Conventional approaches have attempted to provide solutions to this problem. In one method, an electrode type source is used to induce current on the target casing to thereby generate a magnetic field. Gradient of the magnetic field radiated by the target casing, in addition to the magnetic field itself, is measured using two receivers which often require in-situ calibration. By using a relationship between the magnetic field and its gradient, an accurate ranging measurement is made. However, since two receivers are utilized, in-situ calibration of the receivers is often required.

DESCRIPTION OF ILLUSTRATIVE EMBODIMENTS

Figure 1B:
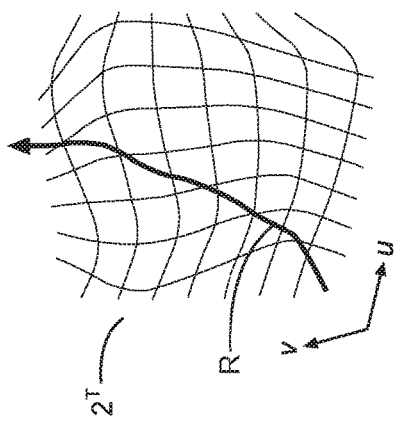
FIG. 1B illustrate a ray R along a transformed space having a u-v axis.

Illustrative embodiments and related methodologies of the present disclosure are described below as they might be employed in an electromagnetic field measuring devices that inverts and splits electromagnetic waves. In the interest of clarity, not all features of an actual implementation or methodology are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure. Further aspects and advantages of the various embodiments and related methodologies of the disclosure will become apparent from consideration of the following description and drawings.

As described herein, illustrative embodiments and methodologies of the present disclosure describe electromagnetic field measuring devices that manipulate electromagnetic waves/fields using transformation optics to thereby produce signals that may be utilized for a variety of applications. In one illustrative generalized embodiment, a metamaterial-based measuring device includes a receiver having a first and second input through which to receive electromagnetic waves. An electromagnetic field ("EMF") rotation medium comprised of metamaterial is coupled to the second input path of the receiver. The EMF rotation medium receives an electromagnetic field having a first spatial angle, and then rotates the first spatial angle to a second spatial angle. Therefore, the rotated electromagnetic field is out of spatial phase with the original electromagnetic field by a given degree. In other words, being out of spatial phase by a given degree means that one component of the electric/magnetic field is a rotated version of the other after rotation of a given angle is applied by the metamaterial of the EMF rotation medium.

During operation of this generalized embodiment, the receiver receives electromagnetic fields into its first and second input paths. The electromagnetic field received through the first input path may be an electromagnetic field directly from the environment, while the electromagnetic field received through the second input path is the rotated electromagnetic field. Once received, the receiver superimposes the two electromagnetic fields to produce a signal which may be further processed for any desired application. For example, the signal may be utilized to obtain a gradiometric measurement. In such embodiments, the rotated electromagnetic field is rotated substantially 180 degrees with respect to the original electromagnetic field, thereby essentially inverting the two fields, as will be described in more detail below. In an alternative embodiment, two EMF rotation mediums may be coupled to the receiver to provide two electromagnetic fields that have been rotated substantially 90 degrees in the opposite direction with respect to one another, thus also resulting in inverted electromagnetic fields being received at the receiver.

Accordingly, illustrative embodiments described herein are particularly useful in gradiometric applications because only one receiver is needed to perform the gradient measurement. Furthermore, since only one receiver is necessary in such applications, there is no need for in-situ calibration. These and other advantages and applications of the present disclosure will be apparent to those ordinarily skilled in the art having the benefit of this disclosure.

As previously mentioned, illustrative embodiments of the present disclosure utilize transformation optics to control electromagnetic fields. Such transformations may be realized in a variety of ways including, for example, metamaterials. Metamaterials are artificially-engineered composites that inherit their electrical properties from the geometry and arrangement of their constituting unit cells. Metamaterials can be realized in many different ways depending on the operation frequency. In the illustrative embodiments described herein, the metamaterial-based electromagnetic field measuring device is designed for inverted splitting of electromagnetic waves.

Figure 1D:
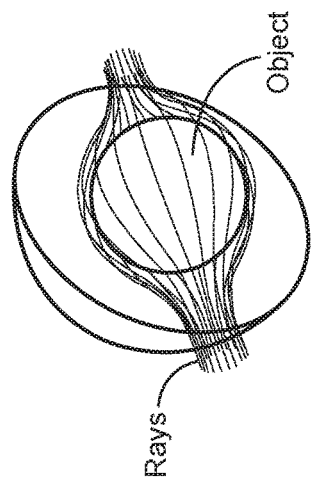
FIG. 1D illustrates a number of rays R in a 3D cloak.
Figure 1A:
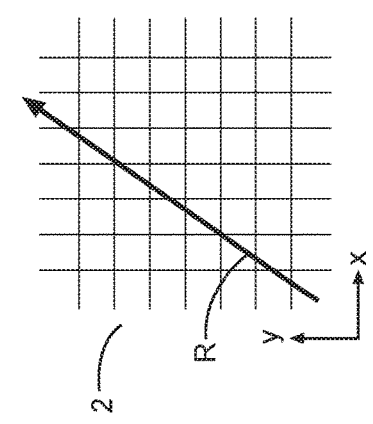
FIG. 1A illustrates a ray R along an original space having an x-y axis.
Figure 1C:
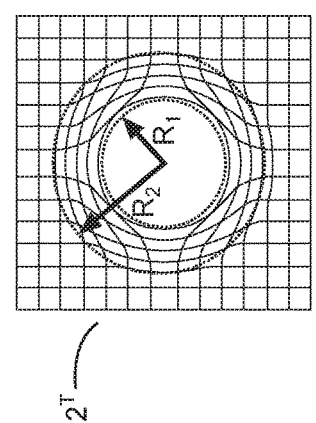
FIG. 1C illustrates a transformed space for a cloaking application.

Certain principles of transformation optics should be described at the outset. FIG. 1A illustrates a ray R along an original space 2 having an x-y coordinate system. Suppose that the underlying grid (original space 2) is "elastic" and can be deformed to achieve certain field shaping as shown in FIG. 1B. As a result, a transformed space $2^T$ is formed having a u-v coordinate system. As a result of the form-invariance of Maxwell's equation under coordinate transformation, such transformations can be interpreted as if the original medium within the deformed space is replaced by a generally anisotropic and inhomogeneous medium. Materials having such properties may not exist in nature and, therefore, are referred to as "metamaterials". One illustrative application of transformation optics is invisibility cloaking. FIG. 1C shows transformed space $2^T$ for a cloaking application. Here, space $2^T$ is transformed such as to create an enclosure in the inner region ($\rho<R_1$), while maintaining the grid intact in the outer region ($\rho>R_2$). The region $R_1<\rho<R_2$ is where a metamaterial is used to mimic the shown grid deformation. The described transformation allows rays to be smoothly steered around the inner region regardless of the material content of this inner space, rendering any object placed in the inner space invisible, as shown in FIG. 1D.

A mathematical description of transformation optics will now be provided. In the original space (FIG. 1A), we have Maxwell's equations:

$$\nabla \times E = -j\omega\mu H \quad \text{Eq. (1a), and}$$

$$\nabla \times H = j\omega\epsilon E + J_s \quad \text{Eq. (1b).}$$

Consider the following transformation in cylindrical coordinates:

$$\rho' = \rho'(\rho,\phi,z) \quad \text{Eq. (2a),}$$

$$\phi' = \phi'(\rho,\phi,z) \quad \text{Eq. (2b), and}$$

$$z' = z'(\rho,\phi,z) \quad \text{Eq. (2c).}$$

Maxwell's equations are form-invariant under coordinate transformation. In the transformed space, they take the following form:

$$\nabla' \times E' = -j\omega\mu' H' \quad \text{Eq. (3a) and}$$

$$\nabla' \times H' = j\omega\epsilon' E' + J'_s \quad \text{Eq. (3b),}$$

where:

$$\mu' = \frac{A\mu A^T}{|A|}, \quad \text{Eq.(4a)}$$

$$\epsilon' = \frac{A\epsilon A^T}{|A|}, \quad \text{Eq.(4b)}$$

$$J'_s = \frac{AJ_s|J_s|}{|AJ_s|}, \quad \text{Eq.(4c)}$$

and $$A = \begin{bmatrix} \frac{\partial\rho'}{\partial\rho} & \frac{\partial\rho'}{\rho\partial\phi} & \frac{\partial\rho'}{\partial z} \\ \frac{\rho'\partial\phi'}{\partial\rho} & \frac{\rho'\partial\phi'}{\rho\partial\phi} & \frac{\rho'\partial\phi'}{\partial z} \\ \frac{\partial z'}{\partial\rho} & \frac{\partial z'}{\rho\partial\phi} & \frac{\partial z'}{\partial z} \end{bmatrix} \quad \text{Eq.(5)}$$

is the Jacobian matrix of the transformation. The above are the material properties and the equivalent current source that should be used to realize the prescribed coordinate transformation. Transformations that preserve grid continuity across the transformed space boundary result in reflectionless, iso-impedance metamaterials. Another class of transformations exists, called embedded transformations, in which the grid continuity is broken and therefore reflectionless transmission across the metamaterial/background medium interface is not guaranteed. However, embedded transformations provide a higher degree of flexibility for manipulating fields outside the metamaterial device, and can be designed in such a way to minimize spurious reflections.

Practical realization of metamaterials utilized in certain illustrative embodiments of the present disclosure will now be described. While conventional materials attain their macroscopic properties from the chemical composition of the constituting atoms, metamaterials attain their macroscopic properties from the artificially engineered constituting unit cells. Metamaterials have been realized in many different ways depending on the application and the frequency of operation. A few illustrative realizations will be described below; however, such realizations are neither exhausted nor intended to limit the scope of this disclosure.

Figure 2:
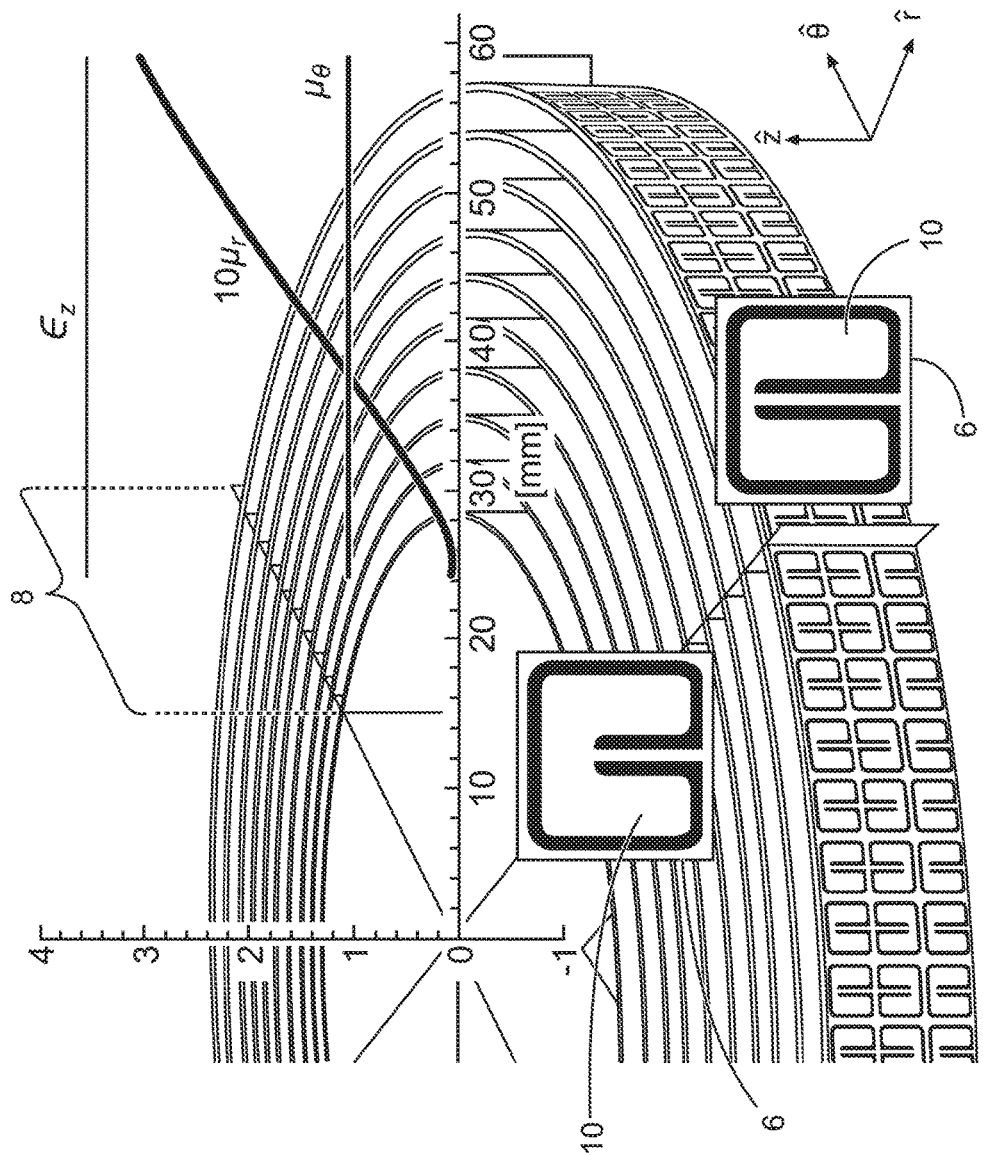
FIG. 2 illustrates an invisibility cloak operating at 8.5 GHz realized using split ring resonators as the metamaterials, according to an illustrative embodiment of the present disclosure.

FIG. 2 illustrates an invisibility cloak operating at, for example, 8.5 GHz realized using split ring resonators as the metamaterials, which may be utilized as the metamaterial in an illustrative embodiment of the present disclosure. The illustrated two-dimensional invisibility cloak 4 requires the radial component of the permeability tensor ($\mu_{rr}$) to vary radially as shown in the insets 6 of FIG. 2, one being located at approximately 30 mm and the other being located at approximately 60 mm. This profile is realized using ten cylinders 8 with printed split ring resonators ("SRRs") 10. The dimensions of the SRRs 10 in each cylinder are adjusted to achieve the required profile. To be able to describe the collection of SRRs 10 with effective macroscopic material properties, the dimension of the unit cell has to be much smaller than the operating wavelength, which is referred to as the homogenization condition. Nevertheless, the dimension of SRRs 10 has to be large enough to resonate at or near the operating frequency.

In other embodiments, the metamaterials utilized may be alternative electric and magnetic metamaterial layers. In such embodiments, the electric layers realize the discretized $\epsilon_{zz}$ profile using five sets of electric-LC resonators ("ELCs"), whereas magnetic layers realize the discretized $\mu_{yy}\mu_{yy}$ profile using SRRs. Negative index of refraction ("NIR") lens (also known as the perfect lens) is another example of embedded transformation optics where double negative ("DNG") metamaterials (also known as left-handed ("LH") metamaterials) are used. Negative permeability is realized using SRRs whereas negative permittivity is realized using thin wires.

At lower frequencies, the dimensions of the SRRs and ELCs required to resonate as the operating frequency become prohibitively large for practical realization. However, lumped components can be used to achieve resonance at lower frequencies without increasing the unit cell dimensions. For example, single negative ("SNG") lenses for use in magnetic resonance imaging ("MRI") may be utilized as the metamaterial. Such capacitively loaded metamaterial lenses have been used to enhance the sensitivity and spatial resolution of RF coils in MRI systems. Note that since the operating wavelength of MRI RF coils is much larger than the coil dimensions (quasi-magnetostatics regime), an NIR MM lens can be sufficiently implemented as a SNG lens with $\mu_r$ r=−1.

In yet other illustrative embodiments, an alternative design of DNG metamaterials which may be utilized are chiral materials. A chiral metamaterial consists of insulated metal strips wound in a helix, and then individual helixes are stacked in a 3-D arrangement to form an isotropic DNG structure. This design has the advantage that its unit cells (chiral helixes) can have internal resonances with dimensions in the order of ¹⁄₁₀₀₀th of the operating wavelength. This feature is particularly important for designing metamaterials operating at very low frequencies (quasi-static metamaterials).

One feature of the metamaterial realization techniques described above is that they rely on resonant structures, in one way or the other. As a result, the metamaterial is highly dispersive and lossy when operated near resonance, which also means that a metamaterial with given properties can only be designed to operate at a single frequency.

There are a variety of other metamaterial realizations which may be utilized in embodiments of the present disclosure. For example, the use of metamaterials has also been extended to quasi-static and DC applications. Examples include a DC diamagnetic metamaterial, a DC magnetic cloak, and a DC electric concentrator.

Now that a variety of metamaterial realizations have been disclosed, illustrative embodiments of the present disclosure will now be described. Although the electromagnetic field measuring devices described herein may be utilized in a variety of applications, the following description will focus on downhole ranging applications for accurately, and reliably positioning a well being drilled, the "injector" well, with respect to a nearby target first well, usually the producer well, so that the injector well can be maintained approximately parallel to the producer well. In such an embodiment, the target well must be of a higher conductivity than the surrounding formation, which may be realized through the use of an elongated conductive body along the target well, such as, for example, casing which is already present in most wells to preserve the integrity of the well. These and other applications and/or adaptations will be understood by those ordinarily skilled in the art having the benefit of this disclosure.

Figure 3:
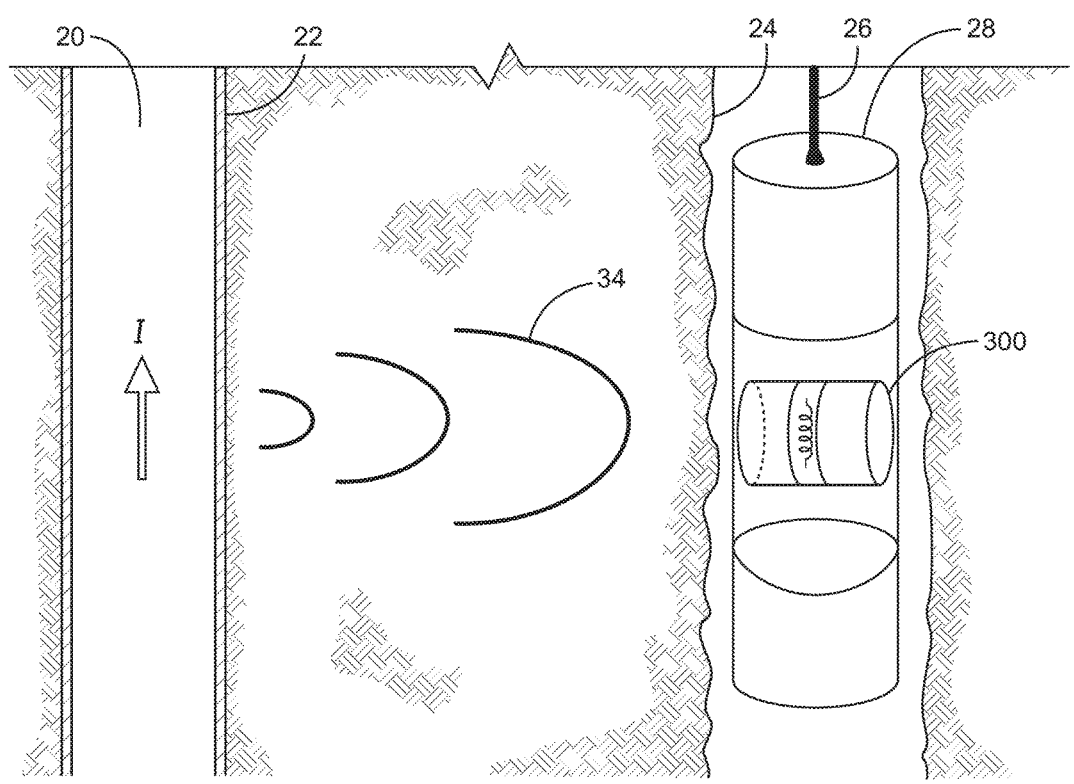
FIG. 3 illustrates an electromagnetic measuring device according to an illustrative embodiment of the present disclosure.

FIG. 3 illustrates an electromagnetic measuring device 300 positioned along a downhole well, according to an illustrative embodiments of the present disclosure. In this embodiment, a first well 20 is drilled using any suitable drilling technique. Thereafter, first well 20 is cased with casing 22. A second well 24 is then drilled using a suitable drilling assembly (not shown) which may be, for example, a logging-while drilling ("LWD") assembly, measurement-while drilling assembly ("MWD") or other desired drilling assembly. Although second well 24 is described as being subsequently drilled, in other embodiments first well 20 and second well 24 may be drilled simultaneously. In such a case, the drill collar of first well 20 may functionally act as casing 22.

After second well (i.e., ranging borehole) 24 is drilled, a wireline assembly is deployed downhole via wireline 26 to perform ranging operations. The ranging operations may be performed to measure distance and direction of one well from the other which may be used in applications to drill parallel wells in a SAGD operation, avoid well collisions in congested areas, or intersect wells in relief well operations. Electromagnetic measuring device 300 forms part of the wireline assembly, and is housed in a housing 28. Housing 28 may be any temperature and pressure resistant housing suitable for downhole ranging applications. For example, it could be a drill collar section that is made of non-ferrous metal, such as stainless steel. As will be described below, electromagnetic measuring device 300 enables, for example, gradiometric ranging to be conducted with the use of only one receiver.

Figure 4A:
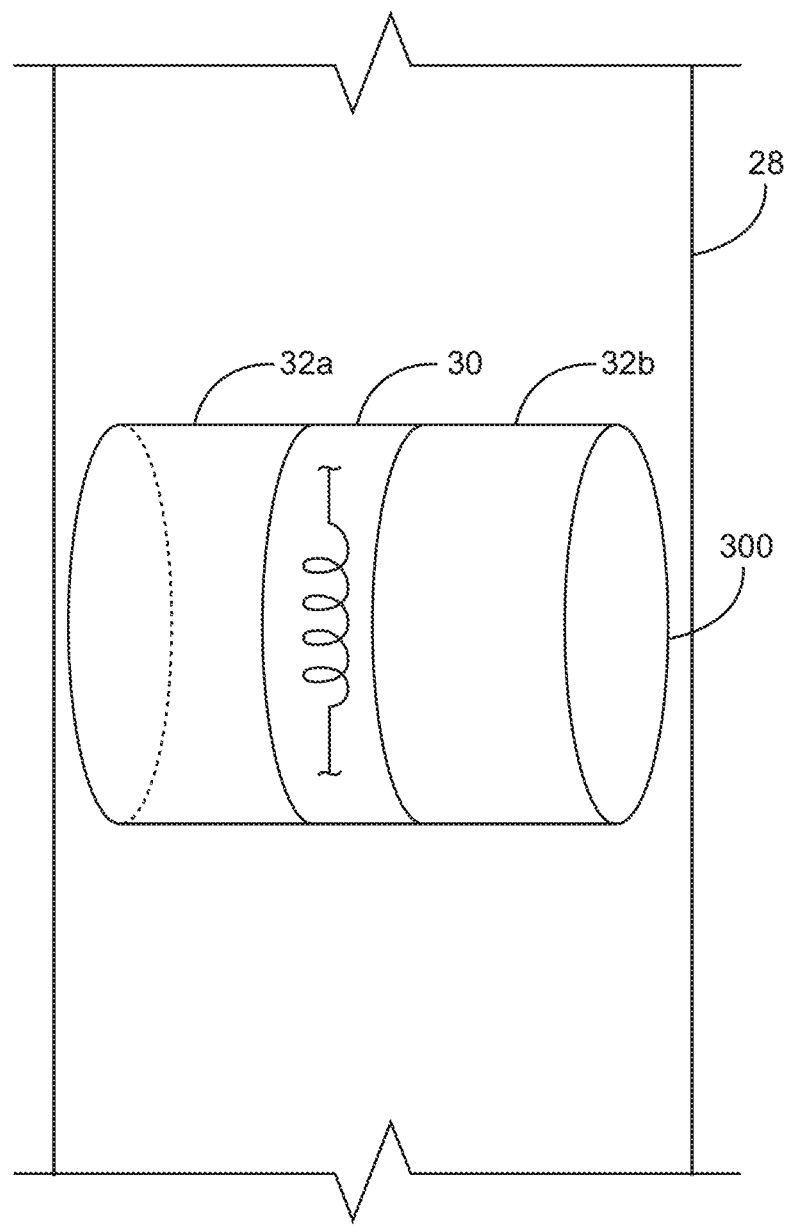
FIG. 4A is an exploded view of the electromagnetic measuring device of FIG. 3.

FIG. 4A is an exploded view of electromagnetic measuring device 300. As shown, electromagnetic measuring device 300 includes a receiver 30 positioned between two EMF rotation mediums 32a and 32b. Receiver 30 and the EMF rotation mediums 32a and 32b do not have to be in contact with one another, however the distance between receiver 30 and EMF rotation mediums 32a and 32b needs to be minimized to reduce unaccounted geometric spreading or propagation effects. Receiver 30 may be realized, for example, coils, solenoids, magnetometers, or a variety of other realizations that approximate magnetic or electrical dipoles. EMF rotation mediums 32a and 32b are comprised of a metamaterial, as previously described, which both act as polarization rotators of electromagnetic fields. EMF rotation mediums 32a and 32b are two symmetrical halves of the same metamaterial with respect to the measurement center of receiver 30. In certain embodiments, EMF rotation mediums 32a and 32b may be separate pieces coupled to both sides of receiver 30. In other embodiments, EMF rotation mediums 32a and 32b are one monolithic piece having a spacing (e.g., groove) extending through its center wherein the receiver 30 may be positioned. Nevertheless, in either embodiment, the EMF rotation devices on either side of receiver 30 must be symmetrical with respect to the measurement center of receiver 30.

Figure 4B:
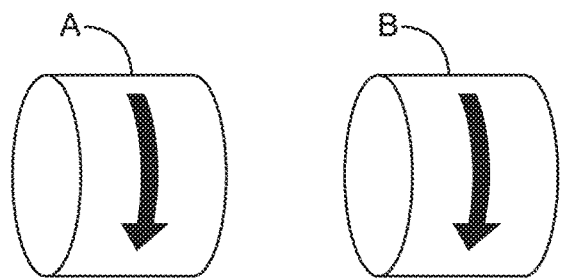
FIG. 4B illustrates non-inversion of electromagnetic field rotation mediums.
Figure 4C:
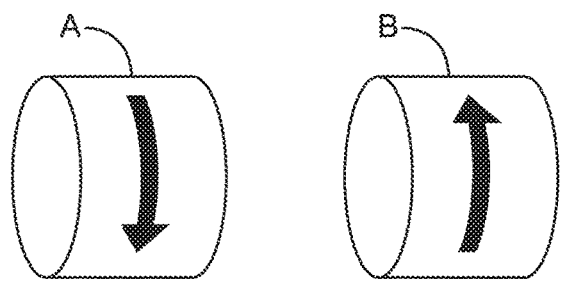
FIG. 4C illustrates inverted electromagnetic field rotation mediums.

EMF rotation mediums 32a and 32b may be inverted with respect to one another. FIGS. 4B and 4C illustrate this concept, with FIG. 4B showing non-inverted EMF rotation mediums and FIG. 4C showing inverted EMF rotation mediums. In FIG. 4B, EMF rotation mediums A and B are non-inverted, meaning that for a given same incident field they produce the same field vector direction at their receiver ports. However, in FIG. 4C, EMF rotation mediums A and B have been inverted, meaning that for a given same incident field they produce the opposite field vector direction at their receiver ports. In this illustrative embodiment, the identical EMF rotation mediums A and B are rotated by 90 degrees with respect to each other so as to deliver out-of-phase electromagnetic signals to receiver 30. Here, "phase" refers to the spatial phase angle of the electromagnetic wave, which is the degree of rotation of the wave in space. Thus, being out-of-phase means being misaligned (also referred to herein as being "out of spatial phase"). Being out-of-phase by a given degree means one component of the electric/magnetic field is a rotated version of the other after rotation of a given angle is applied by the EMF rotation mediums.

Figure 4D:
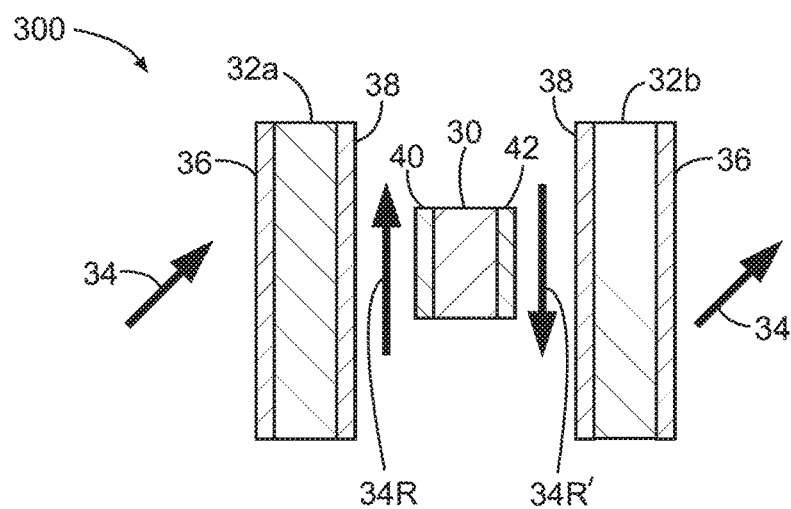
FIG. 4D is a block diagrammatical representation of the electromagnetic field measuring device of FIG. 3 having two electromagnetic field rotation mediums.

FIG. 4D is a block diagrammatical representation of electromagnetic field measuring device 300 useful to illustrate the rotation of the spatial phase angle. As previously mentioned, EMF rotation mediums 32a and 32b have been rotated 90 degrees with respect to one another. As a result, during operation an electromagnetic wave 34 is emitted from a source such as, for example, a cased wellbore or the environment itself. As represented by the arrows 34, the electromagnetic waves have a first spatial angle oriented in the same direction as they travel into inputs 36 of EMF rotation mediums 32a and 32b. Due to the inverted nature of EMF rotation mediums 32a and 32b, the metamaterial of EMF rotation medium 32a rotates the first spatial angle of wave 34 90 degrees to a second spatial angle, thus producing a rotated electromagnetic wave 34R at the output 38. The metamaterial of EMF rotation medium 32b rotates the first spatial angle of its wave 34 by 90 degrees also to a second spatial angle. However, because of the inverted nature of EMF rotation medium 32b, this rotation is in a direction opposite from the direction of rotation of electromagnetic wave 34R. Thus, EMF rotation medium 32b produces a rotated electromagnetic wave 34R' at its output 38. Inputs 36 represent the incident magnetic fields (e.g., EM wave 34) which need to be measured. Outputs 38 represent the magnetic fields (EM wave 34R, 34R') that are electromagnetically superposed on the receiver to create the gradient signal.

Still referring to FIG. 4D, receiver 30 includes a first input path 40 and a second input path 42 through which to receive electromagnetic waves. Rotated electromagnetic wave 34R is received through first input path 40 whereby a first signal is produced. Rotated electromagnetic wave 34R' is received through second input path 42 whereby a second signal is produced. Since the second spatial angles of rotated electromagnetic waves 34R and 34R' are oriented in the opposite direction by a total of 180 degrees in this example, the resultant first and second signals may be utilized to determine the gradient. Therefore, in this illustrative embodiment, first and second signals are superimposed electromagnetically on receiver 30 to produce a signal proportional to a gradiometric measurement of electromagnetic wave 34. When geometric spreading that may occur between rotating medium 32a and 32b and 30 is ignored, the measurement is equivalent to the difference between the magnetic fields at inputs 36 with a spacing equivalent to the distance between the inputs 36. However, when the geometric spreading effect is included, the equivalent spacing may be different than the ideal one. As a result, up to a scaling constant, the reading of receiver 30 is proportional to the gradient of the ambient field. The scaling constant may be calculated through a calibration procedure that involves lab measurements with a controlled reference source.

Accordingly, due to the inverted nature of the metamaterial, the illustrative embodiment of electromagnetic field measuring device 300 allows computation of the gradient using only one measurement (via a single receiver). In contrast, however, prior art gradient tools (e.g., ranging tools) require the use of two sensitive receivers to measure electromagnetic fields in order to obtain the gradient. Processing circuitry then analyzes the measured fields, whereby they are differenced and divided by their spacing to obtain the gradient. In the illustrative embodiments described herein, however, the metamaterial of the EMF rotation mediums performs the gradient calculations and, thus, there is no need for processing circuitry to perform such calculations. Moreover, since only one receiver may be utilized, there is no need for multiple receiver calibration as in prior art tools.

Figure 5:
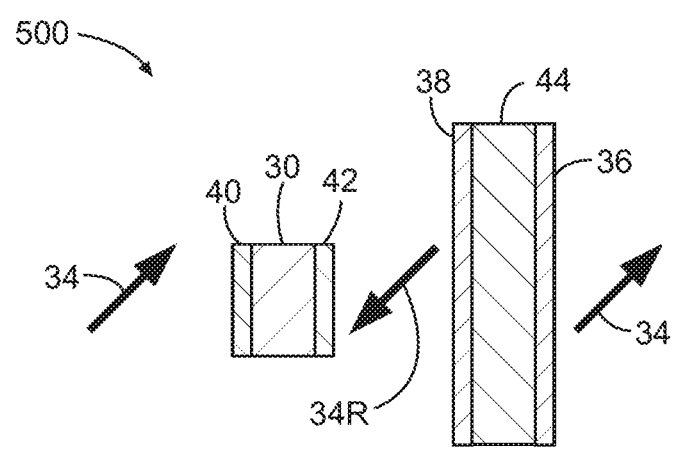
FIG. 5 is a block diagrammatical representation of an electromagnetic field measuring device having a single electromagnetic field rotation medium, according to an alternative embodiment of the present disclosure.

FIG. 5 is a block diagrammatical representation of electromagnetic field measuring device 500 useful to illustrate the rotation of the spatial phase angle, according to one or more embodiments of the present disclosure. Electromagnetic field measuring device 500 is somewhat similar to device 300 described previously and, therefore, may be best understood with reference thereto, where like numerals indicate like elements. In contrast to system 300, however, electromagnetic field measuring device 500 only utilizes a single EMF rotation medium 44. The metamaterial utilized in EMF rotation medium 44 is designed to rotate the spatial angle of an incoming electromagnetic wave 180 degrees. As previously described, this is accomplished by using a metamaterial that performs a coordinate transformation equivalent to a rotation of 180 degrees. Such metameterial can be realized by using chiral or other appropriate type of materials.

Therefore, during operation of electromagnetic field measuring device 500, an electromagnetic wave 34 is emitted from a source such as, for example, a cased wellbore or the environment itself. As represented by the arrows 34, the electromagnetic waves have a first spatial angle oriented in the same direction as it travels into input 36 of EMF rotation medium 44. At the same time, electromagnetic wave 34 also travels into first input path 40 of receiver 30 to produce a first signal. The metamaterial of EMF rotation medium 44 rotates the first spatial angle of wave 34 180 degrees to a second spatial angle, thus producing a rotated electromagnetic wave 34R at the output 38. Rotated electromagnetic wave 34R is received through second input path 42 whereby a second signal is produced. Since the second spatial angle of rotated electromagnetic wave 34R is oriented at 180 out of spatial phase with respect to electromagnetic wave 34, the resultant first and second signals may be utilized to determine the gradient. Therefore, in this illustrative embodiment, receiver 30 then superimposes the first and second signals to produce a signal proportional to a gradiometric measurement of electromagnetic wave 34.

As previously described, the electromagnetic field measuring devices disclosed herein may be utilized in different applications. Such applications include, for example, EM controlled source survey measurements, cross-well tomography or downhole applications such as logging or wireline assemblies. Although FIG. 3 illustrates electromagnetic field measuring device 300 positioned along a wireline assembly, the following example will describe its use along a drilling assembly. Thus, with reference to FIG. 3, when utilized in a downhole ranging application, a drilling assembly (including electromagnetic field measuring device 300,500) (not shown) may be deployed downhole to drill a first well 24 (e.g., injector well) after, or contemporaneously with, the drilling of second well 20 (e.g., producer well). In order to maintain first well 24 at the desired distance and direction from the second well, current I is induced along casing 22 of second well 20 that results in a magnetic field 34 radiating from casing 22 toward electromagnetic field measuring device 300,500 in first well 24. Electromagnetic fields 34 are then received by electromagnetic field measuring device 300,500, whereby the gradient is determined as described above. Thereafter, the gradiometric data may be utilized to determine the distance and direction to second well 20. Once the relative position is determined, processing circuitry may then generate signals necessary to steer the drilling assembly in the direction needed to maintain the desired distance and direction from second well 20.

Figure 6:
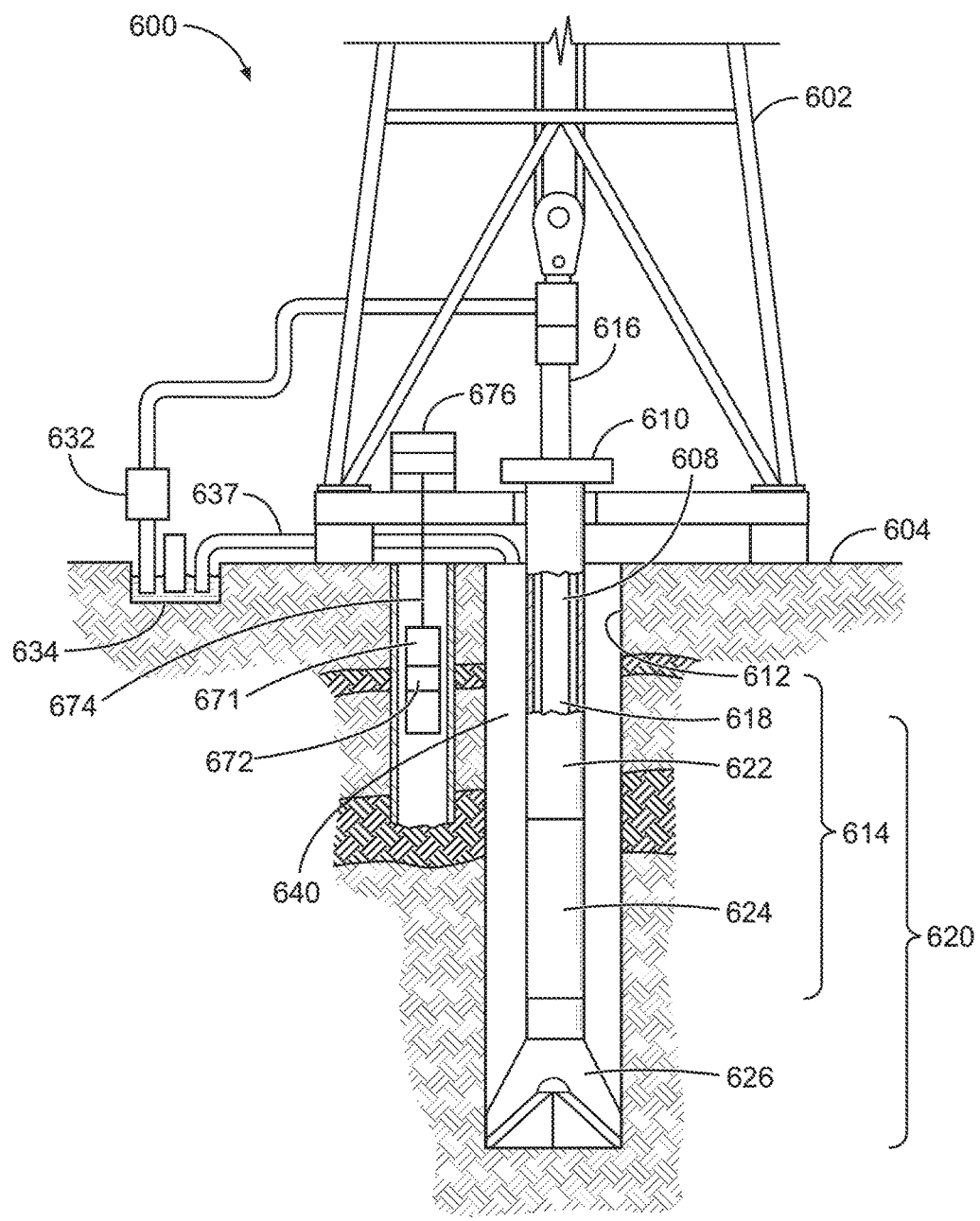
FIG. 6 illustrates the electromagnetic measuring devices deployed in a drilling and wireline application, according to certain illustrative methods of the present disclosure.

FIG. 6 illustrates a system 600 for ranging operations according to an illustrative embodiments of the present disclosure. It should be noted that the system 600 can also include a system for pumping or other operations. System 600 includes a drilling rig 602 located at a surface 604 of a wellbore. Drilling rig 602 provides support for a down hole apparatus, including a drill string 608. Drill string 608 penetrates a rotary table 610 for drilling a borehole/wellbore 612 through subsurface formations 614. Drill string 608 includes a Kelly 616 (in the upper portion), a drill pipe 618 and a bottom hole assembly 620 (located at the lower portion of drill pipe 618). In certain illustrative embodiments, bottom hole assembly 620 may include drill collars 622, a downhole tool 624 and a drill bit 626. Although downhole tool 624 may be any of a number of different types of tools including measurement-while-drilling ("MWD") tools, logging-while-drilling ("LWD") tools, etc., in this embodiment downhole tool 624 is any one of the electromagnetic field measuring devices described herein.

During drilling operations, drill string 608 (including Kelly 616, drill pipe 618 and bottom hole assembly 620) may be rotated by rotary table 610. In addition or alternative to such rotation, bottom hole assembly 620 may also be rotated by a motor that is downhole. Drill collars 622 may be used to add weight to drill bit 626. Drill collars 622 also optionally stiffen bottom hole assembly 620 allowing it to transfer the weight to drill bit 626. The weight provided by drill collars 622 also assists drill bit 626 in the penetration of surface 604 and subsurface formations 614.

During drilling operations, a mud pump 632 optionally pumps drilling fluid (e.g., drilling mud), from a mud pit 634 through a hose 636, into drill pipe 618, and down to drill bit 626. The drilling fluid can flow out from drill bit 626 and return back to the surface through an annular area 640 between drill pipe 618 and the sides of borehole 612. The drilling fluid may then be returned to the mud pit 634, for example via pipe 637, and the fluid is filtered. The drilling fluid cools drill bit 626, as well as provides for lubrication of drill bit 626 during the drilling operation. Additionally, the drilling fluid removes the cuttings of subsurface formations 614 created by drill bit 626.

Still referring to FIG. 6, downhole tool 624 may also include any number of sensors which monitor different downhole parameters and generate data that is stored within one or more different storage mediums within the downhole tool 624. Alternatively, however, the data may be transmitted to a remote location (e.g., surface) and processed accordingly. Such parameters may include logging data related to the various characteristics of the subsurface formations (such as resistivity, radiation, density, porosity, etc.) and/or the characteristics of the borehole (e.g., size, shape, etc.), etc.

FIG. 6 also illustrates an alternative embodiment in which a wireline system is deployed. In such an embodiment, the wireline system may include a downhole tool body 671 coupled to a base 676 by a logging cable 674. Logging cable 674 may include, but is not limited to, a wireline (multiple power and communication lines), a mono-cable (a single conductor), and a slick-line (no conductors for power or communications). Base 676 is positioned above ground and optionally includes support devices, communication devices, and computing devices. Tool body 671 houses any one of the electromagnetic field measurement devices 672 described herein. In an embodiment, a power source (not shown) is positioned in tool body 671 to provide power to the tool 671. In operation, the wireline system is typically sent downhole after the completion of a portion of the drilling. More specifically, in certain methods, drill string 508 creates borehole 612, then drill string 608 is removed, and the wireline system is inserted into borehole 612, as will be understood by those ordinarily skilled in the art having the benefit of this disclosure. Note that only one borehole is shown for simplicity in order to show the tools deployed in drilling and wireline applications. In certain applications, such as ranging, multiple boreholes would be drilled as understood in the art.

Metamaterials possess many advantages when applied in downhole applications. First, for example, the narrow band, single frequency operation of many downhole tools works well with metamaterials because practical realizations of metamaterials work well over narrow bands. Second, the cylindrical geometry of many downhole tools also provides an advantage. Here, some available practical metamaterial realizations have two dimensional variations with no variation in the third dimension. In boreholes, geometric variation in the axial dimension can often be neglected which makes it a good match.

Third, the low frequency operating range of may downhole tools makes the homogenization principle easily applicable. The polarization rotating metamaterials are based on embedded transformation optics, which means that the grid continuity across the interface of the metamaterial is broken. This gives rise to spurious distortion as the electromagnetic signal crosses this interface. However, in practice this distortion can be neglected especially at the low frequencies of operation used in ranging.

Fourth, electric and magnetic fields are decoupled in many downhole tools, which facilitate the realization of metamaterials using a reduced set of material properties. Fifth, most downhole tools have a predefined field polarization, which makes it easier to design the metamaterial using a reduced set of parameters. Sixth, if SNG and DNG are not needed, non-resonant, low loss metamaterials operating at wavelengths much longer than the unit cell can be designed.

Accordingly, the electromagnetic field measuring devices described herein enable gradient ranging differential measurements using one receiver instead of two as in conventional tools—which reduces the cost of the tool. The inverted splitting metamaterial may be factory manufactured to ensure symmetry, and hence no further in-situ calibration is required. Moreover, since only one receiver is utilized, no calibration of multiple receivers is necessary either.

Embodiments described herein further relate to any one or more of the following paragraphs:

1. An electromagnetic field measuring device, comprising a receiver comprising: a first input path through which to receive an electromagnetic field and thereby produce a first signal by the receiver; and a second input path through which to receive an electromagnetic field and thereby produce a second signal by the receiver; and a first electromagnetic field ("EMF") rotation medium coupled to the second input path of the receiver, the first EMF rotation medium comprising: an input to receive an electromagnetic field having a first spatial angle, the EMF rotation medium being configured to rotate the first spatial angle to a second spatial angle; and an output through which the electromagnetic field having the second spatial angle travels into the second input path of the receiver to thereby produce the second signal.

2. A device as defined in paragraph 1, wherein the first EMF rotation medium is comprised of a metamaterial.

3. A device as defined in paragraphs 1 or 2, wherein the receiver is a magnetic dipole.

4. A device as defined in any of paragraphs 1-3, wherein the receiver is an electric dipole.

5. A device as defined in any of paragraphs 1-4, wherein: the EMF rotation medium is configured to rotate the first spatial angle to a second spatial angle that is substantially 180 degrees out of spatial phase with respect to the first spatial angle; and the receiver is configured to superimpose the first and second signals to thereby produce a signal proportional to a gradiometric measurement.

6. A device as defined in any of paragraphs 1-5, further comprising a second EMF rotation medium coupled to the first input path of the receiver, the second EMF rotation medium comprising: an input to receive an electromagnetic field having a first spatial angle, the second EMF rotation medium being configured to rotate the first spatial angle to a second spatial angle; and an output through which the electromagnetic field having the second spatial angle travels into the first input path of the receiver to thereby produce the first signal.

7. A device as defined in any of paragraphs 1-6, wherein the first and second rotation mediums comprise a substantially symmetric construction with respect to a measurement center of the receiver.

8. A device as defined in any of paragraphs 1-7, wherein: the second spatial angle generated by the first EMF rotation medium is a rotation of substantially 90 degrees with respect to the first spatial angle; the second spatial angle generated by the second EMF rotation medium is a rotation of substantially 90 degrees with respect to the first spatial angle, the rotation of the second EMF rotation medium being in an opposite direction with respect to the rotation of the first EMF rotation medium; and the receiver is configured to superimpose the first and second signals to thereby produce a signal proportional to a gradiometric measurement.

9. A device as defined in any of paragraphs 1-8, wherein: the receiver is located in one wellbore; and a source of the electromagnetic signals is located in a second well.

10. A device as defined in any of paragraphs 1-9, further comprising processing circuitry to calculate a distance between the first and second wells using the first and second signals.

11. A device as defined in any of paragraphs 1-10, wherein the receiver forms part of a wireline or drilling assembly.

12. A method for making an electromagnetic field measurement, the method comprising: receiving an electromagnetic field through a first input path of a receiver and producing a first signal in the receiver; receiving an electromagnetic field into a first electromagnetic field ("EMF") rotation medium coupled to the receiver; using the first EMF rotation medium, rotating a first spatial angle of the electromagnetic field to a second spatial angle; and receiving the electromagnetic field having the second spatial angle into a second input path of the receiver, and thereby producing a second signal in the receiver.

13. A method as defined in paragraph 12, further comprising computing a gradiometric measurement using the first and second signals.

14. A method as defined in paragraphs 12 or 13, wherein rotating the first spatial angle of the electromagnetic field to the second spatial angle comprises rotating the first spatial angle substantially 180 degrees.

15. A method as defined in any of paragraphs 12-14, wherein receiving the electromagnetic field through the first input path of the receiver comprises receiving the electromagnetic field directly from an environment adjacent the receiver.

16. A method as defined in any of paragraphs 12-15, wherein receiving the electromagnetic field through the first input path of the receiver comprises: receiving an electromagnetic field into a second EMF rotation medium coupled to the receiver; using the second EMF rotation medium, rotating a first spatial angle of the electromagnetic field to a second spatial angle; and receiving the electromagnetic field having the second spatial angle into the first input path of the receiver, and thereby producing the first signal in the receiver.

17. A method as defined in any of paragraphs 12-16, wherein: using the first EMF rotation medium, rotating the first spatial angle to the second spatial angle comprises rotating the first spatial angle substantially 90 degrees; and using the second EMF rotation medium, rotating the first spatial angle to the second spatial angle comprises rotating the first spatial angle substantially 90 degrees in a direction opposite the rotation applied by the first EMF rotation medium.

18. A method as defined in any of paragraphs 12-17, wherein: a source of the electromagnetic fields is a first wellbore; the receiver is deployed along a second wellbore; and the method further comprises utilizing the first and second signals to determine a distance between the first and second wellbore.

19. A method as defined in any of paragraphs 12-18, further comprising deploying the receiver along a downhole assembly.

Moreover, the methodologies described herein may be embodied within a system comprising processing circuitry to implement any of the methods, or a in a computer-program product comprising instructions which, when executed by at least one processor, causes the processor to perform any of the methods described herein.

Although various embodiments and methodologies have been shown and described, the disclosure is not limited to such embodiments and methodologies and will be understood to include all modifications and variations as would be apparent to one skilled in the art. Therefore, it should be understood that the disclosure is not intended to be limited to the particular forms disclosed. Rather, the intention is to cover all modifications, equivalents and alternatives falling within the spirit and scope of the disclosure as defined by the appended claims.

What is claimed is:

1. An electromagnetic field measuring device, comprising:
 a receiver comprising:
  a first input path through which to receive an electromagnetic field and thereby produce a first signal by the receiver; and a second input path through which to receive an electromagnetic field and thereby produce a second signal by the receiver; and a first electromagnetic field ("EMF") rotation medium coupled to the second input path of the receiver, the first EMF rotation medium comprising:
  an input to receive an electromagnetic field having a first spatial angle, the EMF rotation medium being configured to rotate the first spatial angle to a second spatial angle; and
  an output through which the electromagnetic field having the second spatial angle travels into the second input path of the receiver to thereby produce the second signal.

2. A device as defined in claim 1, wherein the first EMF rotation medium is comprised of a metamaterial.

3. A device as defined in claim 1, wherein the receiver is a magnetic dipole.

4. A device as defined in claim 1, wherein the receiver is an electric dipole.

5. A device as defined in claim 1, wherein:
the EMF rotation medium is configured to rotate the first spatial angle to a second spatial angle that is substantially 180 degrees out of spatial phase with respect to the first spatial angle; and
the receiver is configured to superimpose the first and second signals to thereby produce a signal proportional to a gradiometric measurement.

6. A device as defined in claim 1, further comprising a second EMF rotation medium coupled to the first input path of the receiver, the second EMF rotation medium comprising: an input to receive an electromagnetic field having a first spatial angle, the second EMF rotation medium being configured to rotate the first spatial angle to a second spatial angle; and
  an output through which the electromagnetic field having the second spatial angle travels into the first input path of the receiver to thereby produce the first signal.

7. A device as defined in claim 6, wherein the first and second rotation mediums comprise a substantially symmetric construction with respect to a measurement center of the receiver.

8. A device as defined in claim 6, wherein:
the second spatial angle generated by the first EMF rotation medium is a rotation of substantially 90 degrees with respect to the first spatial angle;
the second spatial angle generated by the second EMF rotation medium is a rotation of substantially 90 degrees with respect to the first spatial angle, the rotation of the second EMF rotation medium being in an opposite direction with respect to the rotation of the first EMF rotation medium; and
the receiver is configured to superimpose the first and second signals to thereby produce a signal proportional to a gradiometric measurement.

9. A device as defined in claim 1, wherein:
the receiver is located in one wellbore; and
a source of the electromagnetic signals is located in a second well.

10. A device as defined in claim 9, further comprising processing circuitry to calculate a distance between the first and second wells using the first and second signals.

11. A device as defined in claim 9, wherein the receiver forms part of a wireline or drilling assembly.

12. A method for making an electromagnetic field measurement, the method comprising: receiving an electromagnetic field through a first input path of a receiver and producing a first signal in the receiver;
receiving an electromagnetic field into a first electromagnetic field ("EMF") rotation medium coupled to the receiver;
using the first EMF rotation medium, rotating a first spatial angle of the electromagnetic field to a second spatial angle; and
receiving the electromagnetic field having the second spatial angle into a second input path of the receiver, and thereby producing a second signal in the receiver.

13. A method as defined in claim 12, further comprising computing a gradiometric measurement using the first and second signals.

14. A method as defined in claim 13, wherein rotating the first spatial angle of the electromagnetic field to the second spatial angle comprises rotating the first spatial angle substantially 180 degrees.

15. A method as defined in claim 12, wherein receiving the electromagnetic field through the first input path of the receiver comprises receiving the electromagnetic field directly from an environment adjacent the receiver.

16. A method as defined in claim 12, wherein receiving the electromagnetic field through the first input path of the receiver comprises:
receiving an electromagnetic field into a second EMF rotation medium coupled to the receiver;
using the second EMF rotation medium, rotating a first spatial angle of the electromagnetic field to a second spatial angle; and
receiving the electromagnetic field having the second spatial angle into the first input path of the receiver, and thereby producing the first signal in the receiver.

17. A method as defined in claim 16, wherein:
using the first EMF rotation medium, rotating the first spatial angle to the second spatial angle comprises rotating the first spatial angle substantially 90 degrees; and
using the second EMF rotation medium, rotating the first spatial angle to the second spatial angle comprises rotating the first spatial angle substantially 90 degrees in a direction opposite the rotation applied by the first EMF rotation medium.

18. A method as defined in claim 12, wherein:
a source of the electromagnetic fields is a first wellbore;
the receiver is deployed along a second wellbore; and
the method further comprises utilizing the first and second signals to determine a distance between the first and second wellbore.

19. A method as defined in claim 12, further comprising deploying the receiver along a downhole assembly.

* * * * *